United States Patent
Colton et al.

(10) Patent No.: US 6,543,292 B1
(45) Date of Patent: Apr. 8, 2003

(54) PIEZORESISTIVE AIR PRESSURE SENSOR

(75) Inventors: Russ F. Colton, Cedar Rapids, IA (US); Daniel W. Cooley, Marion, IA (US); Kenneth J. Van Zee, Hiawatha, IA (US); Mark A. Niday, Cedar Rapids, IA (US); Terry L. Clausen, Tipton, IA (US); Bruce V. Smith, Monticello, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 77 days.

(21) Appl. No.: 09/820,960

(22) Filed: Mar. 29, 2001

(51) Int. Cl.[7] ................................................ G01L 9/00
(52) U.S. Cl. ........................ 73/723; 73/725; 73/727
(58) Field of Search .......................... 73/727, 706, 718, 73/723, 754; 361/283

(56) References Cited

U.S. PATENT DOCUMENTS 4,993,265 A * 2/1991 Koen et al. .................... 73/706
5,852,320 A * 12/1998 Ichihashi .................... 257/419

* cited by examiner

Primary Examiner—Hezron Williams
Assistant Examiner—Jermaine Jenkins
(74) Attorney, Agent, or Firm—Nathan O Jensen; Kyle Eppele

(57) ABSTRACT

A method of manufacturing an air pressure sensor is disclosed. A plurality of sensor circuitry modules are formed on a first side of a silicon wafer. A plurality of cavities on a second side of the silicon wafer are formed. Each of the plurality of cavities is aligned with one of the plurality of sensor circuitry modules. A glass wafer is attached to the second side of the silicon wafer. The silicon wafer and the glass wafer are cut such that a single sensor circuitry module is separated from the other sensor circuitry modules and a portion of the glass wafer remains attached to the sensor circuitry module so that the cavity opposite the sensor circuitry module is enclosed by the portion of the glass wafer to form a reference pressure chamber therebetween. The sensor circuitry module is flexibly mounted to an interior surface of a sensor housing. The sensor circuitry module is electrically connected to external conductive connectors.

10 Claims, 2 Drawing Sheets

PIEZORESISTIVE AIR PRESSURE SENSOR

FIELD OF THE INVENTION

The invention relates to sensors, and more particularly, to a sensor that measures air pressure.

BACKGROUND OF THE INVENTION

Air pressure sensors have found general acceptance as a reliable way to measure the relative altitude of an object. For instance, the altitude of an aircraft may be determined based on readings from an air pressure sensor.

Known pressure sensors use a sensor die, typically in integrated circuit form, to measure the difference between a reference pressure and a pressure that is applied to or sensed by the sensor die. The sensor die is mounted within a sensing assembly, which may be a housing or capsule, to protect the sensor die from damage. A portion of the capsule is evacuated to provide a reference pressure. Sensed air pressure is ported or otherwise connected to the interior of the capsule so that the sensor die can compare the sensed air pressure to the reference pressure. In another sensor design, a portion of the capsule interior is sealed off to prevent corrosion of the circuitry due to atmospheric conditions.

One problem with known air pressure sensors is that a sensor die becomes subject to stress when the sensor die is attached to the capsule. This stress may compromise the delicate pressure measurements that must be made by the sensor.

Another problem is that high-humidity environments cause the sensor to be subject to some inaccuracy. It is postulated that high humidity causes an oxide layer to form and thicken on the surface of the sensor die. This adversely affects pressure readings over a period of time.

Still another problem is that the manufacturing processes necessary to create a vacuum reference pressure within the sensor assembly are time-consuming and expensive. Furthermore, while such processes have been found satisfactory for some sensor applications, other applications, such as vertical height measurements during the flight of an aircraft, require a higher degree of accuracy than may be economically provided by a sensor that is manufactured using such processes.

It is therefore an object of the invention to provide a pressure sensor that is accurate enough to be used in aerospace applications.

It is another object of the invention to provide a pressure sensor that is relatively unaffected by high humidity environments.

It is still another object of the invention to provide a pressure sensor that is manufactured in a way so as to minimize the effects of the manufacturing processes on the measurements made by the pressure sensor.

A feature of the invention is the use of manufacturing techniques that eliminate sources of measurement error.

An advantage of the invention is that a reliable and extremely accurate yet cost-effective pressure sensor may be produced.

SUMMARY OF THE INVENTION

The invention provides a method of manufacturing an air pressure sensor. A plurality of sensor circuitry modules are formed on a first side of a first wafer. A plurality of cavities on a second side of the first wafer are formed. Each of the plurality of cavities is aligned with one of the plurality of sensor circuitry modules. A second wafer is attached to the second side of the first wafer. The first wafer and the second wafer are cut such that a single sensor circuitry module is separated from the other sensor circuitry modules, wherein a portion of the second wafer remains attached to the sensor circuitry module so that the cavity opposite the sensor circuitry module is enclosed by the portion of the second wafer to form a reference pressure chamber therebetween. The sensor circuitry module is flexibly mounted to an interior surface of a sensor housing. The sensor circuitry module is electrically connected to external conductive connectors.

The invention also provides an air pressure sensor, which includes a sensor die that is exposed on at least one side to an air pressure that is to be measured. A glass portion is secured to the sensor die such that a vacuum reference cavity is enclosed therebetween. A housing includes an enclosure in which the sensor die and glass portion are housed, the enclosure being pneumatically connected to the air pressure that is to be measured. An electrical connector communicates air pressure data from the sensor die. A plurality of unconnected adhesive elements flexibly attach the glass plate within the enclosure.

The invention further provides a method of manufacturing an air pressure sensor. A sensor die is connected to a backing plate such that a cavity of reduced pressure is enclosed therebetween. The backing plate is flexibly attached to an interior surface of a housing using an adhesive. The adhesive is applied such that the backing plate is connected to the interior surface of the housing at a plurality of separate, discrete areas.

DETAILED DESCRIPTION OF THE DRAWINGS

Figure 1:
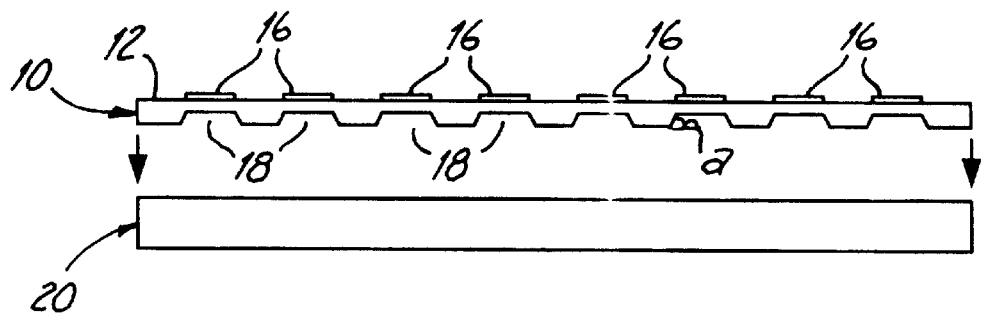
FIG. 1 is a side elevational view of a silicon wafer and glass sheet according to an embodiment of the invention.
Figure 2:
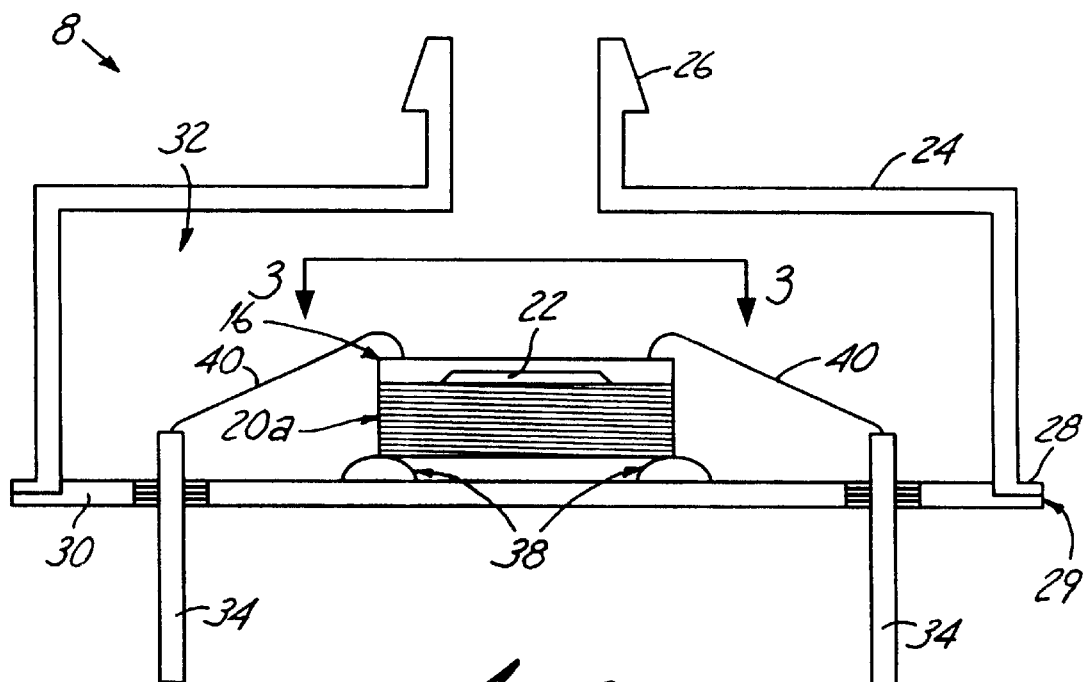
FIG. 2 is a cross-sectional view of a sensor according to the invention.
Figure 3:
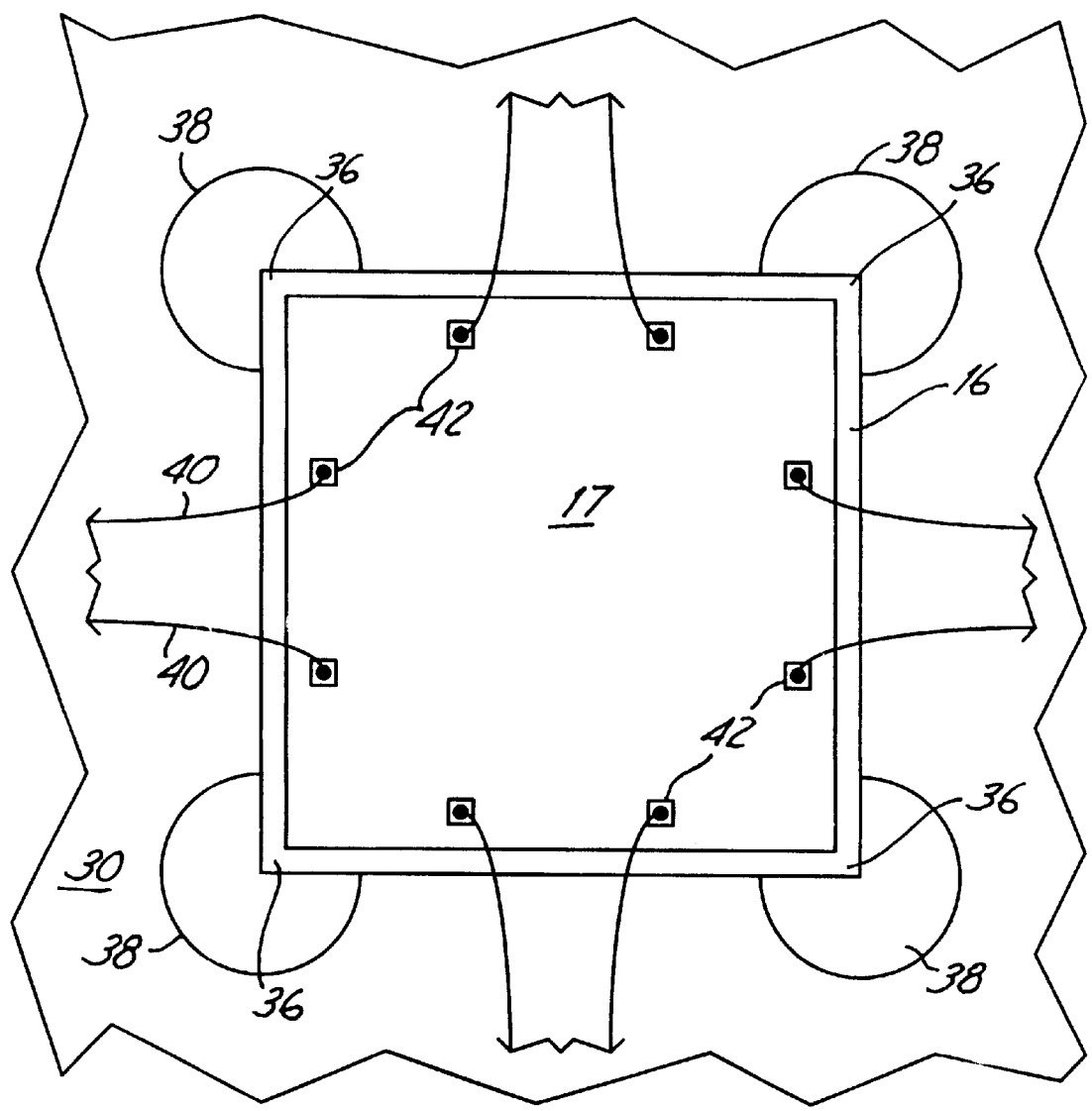
FIG. 3 is a view taken along lines 3—3 in FIG. 2.

FIGS. 1–3 depict a method of manufacturing an air pressure sensor according to an embodiment of the invention. As shown in FIG. 1, a first wafer, which is depicted as a silicon wafer 10, has a first side 12 and a second side 14. Sensor dies or circuitry modules 16 are etched or otherwise formed upon first side 12 of silicon wafer 10. Each sensor die 16 contains circuitry 17 (shown schematically in FIG. 3) that enables the sensor to make reliable pressure measurements. The sensor dies are substantially identical to each other and are preferably formed in an orderly array to maximize the number of dies that can be formed at one time on silicon wafer 10. A plurality of depressions or cavities 18 are etched or otherwise formed on second side 14 of silicon wafer 10. Each cavity 18 is formed directly opposite a sensor die 16. Each cavity 18 preferably is formed with an angle a of about 54.7 degrees, which is determined by the crystal structure of silicon. Each cavity is formed to a depth of between about 70–90% of the thickness of silicon wafer 10.

To ensure that the invention produces reliable measurements when used in a high humidity environment, each sensor die 16 is treated in a high-temperature, high-humidity environment for an extended period of time. It has been found that subjecting the sensor circuitry module to an environment of approximately 120–130 degrees Celsius and 80–90% relative humidity for a period of ten days is sufficient to stabilize the measurements of the sensor in subsequent high-humidity environments. It is postulated that a layer of oxide is formed upon the surface of the circuitry when it is subjected to high humidity environments. As this oxide layer thickens due to repeated exposure to high humidity, the measurements provided by the sensor become less reliable. By subjecting the sensor to a high humidity environment as described above prior to assembly of the sensor, such oxide layer is pre-formed upon the surface of the sensor die, and subsequent humid environments have a less pronounced effect upon the reliability of the sensor's measurements. While this "oxide layer" explanation may be subject to revision in the future, the humidity pre-exposure of the sensor die produces noticeable increases in measurement reliability.

A second wafer, which is depicted as a glass wafer 20, is attached to second side 14 of silicon wafer 10. This may be accomplished by electrostatically bonding glass wafer 20 to silicon wafer 10 in a vacuum environment. Glass wafer 20 is selected to have a coefficient of expansion that substantially matches the coefficient of expansion of silicon wafer 10. As the coefficient of expansion of the silicon wafer may vary over a temperature range, the coefficient of expansion of the glass wafer must also similarly vary. A type of glass sold under the name of SD2 and manufactured by the Hoya Corporation of Tokyo, Japan exhibits such characteristics over a wide temperature range and is satisfactory for this purpose. The combined wafer 10 and glass wafer 20 are cut so that each sensor die 16 is separate from the other dies and has a portion 20a of the glass wafer attached thereto (see FIG. 2). Each sensor die (with attached portion 20a) is then annealed to reduce internal stresses created during the electrostatic bonding process. It has been found that the following annealing strategy is sufficient to reduce such internal stresses: first, subjecting the sensor die and portion 20a to temperatures of 200 degrees Celsius for approximately seven days; and second, steadily decreasing the temperature to 100 degrees Celsius over a period of approximately seven days.

FIG. 2 shows a sensor die 16 attached to portion 20a. Cavity 18 is now closed by portion 20a and forms a hermetically sealed vacuum reference pressure chamber 22. FIG. 2 also shows the remaining components of the air pressure sensor, which is identified by reference number 8. Air pressure sensor 8 includes a cap 24 having a hose fitting 26 at one end and a flange 28 at the other end. Cap 24 is attached at flange 28 to a base 30, which is known in the art as a header. Together cap 24 and base 30 form a capsule 29 which defines an enclosure 32. Enclosure 32 is pneumatically ported or connected to a sensed pressure source. Gold-plated conductive pins 34 pass through base. 30 to provide a means of externally communicating signals from sensor 8.

When viewed from above, glass portion 20a is shown as being polygonal, and specifically, square in shape (FIG. 3), although other geometric shapes (such as hexagonal) may be desirable in some situations. One feature of glass portion 20a is that it insulates sensor die 16 from thermal stresses created within sensor 8. Portion 20a is flexibly secured to base 30 using an adhesive, and preferably a curable silicone adhesive or curable silicone resin. Previous attempts to secure portion 20a to base 30 were such that a substantial portion of the glass portion was in contact with the adhesive. However, thermal stresses between the base and the glass portion through the attachment adhesives or solders tended to affect the readings of the sensor die. To eliminate the effects of these thermal stresses, each corner 36 of portion 20a is secured to base 30 by a dot or drop 38 of adhesive. Each dot 38 is unconnected to other dots of adhesive that are so applied. Gold wire bonds 40 are then connected between gold-plated pads 42 on sensor die 16 and conductive pins 34 to connect the sensor die to electrical circuitry (not shown) that is external to sensor 8.

Dots 38 of adhesive must maintain some flexibility over a functional range of temperatures, pressures, and humidity for a given application. This permits the adhesive to absorb or dissipate much of the thermal stresses that would otherwise be communicated to the sensor die. In an aerospace application the adhesive must remain flexible over a temperature range of −50 degrees Celsius to +70 degrees Celsius. A silicone resin such as Master Bond #803 RTV, manufactured by Master Bond of Hackensack, N.J. possesses satisfactory characteristics to be used as an adhesive in such aerospace applications. Such silicone resin does not become brittle enough to fail to dissipate thermal stresses within that functional temperature range. Alternately, other types of adhesives may be used (such as a flexible epoxy or flexible urethane) provided they possess satisfactory flexibility throughout the functional range of a given application.

From the foregoing disclosure, it can be seen that circuitry 17 on sensor die 16 is exposed to a sensed or applied pressure. This is different from the design of known sensors, where sensor circuitry and the associated electrical connections are typically protected or separated from ambient temperature by enclosing them in evacuated areas of the sensor housing. However, increased accuracy is achieved by placing the sensor die directly in contact with the atmospheric pressure to be measured, as is done in the present invention. By "growing" an oxide layer on the surface of the circuitry and by using gold-plated pads 42, leads 40, and conductive pins 34, the sensitive components of sensor 8 are protected from the corrosive effects of high-humidity environments, and inaccuracies due to such environments are significantly reduced. Furthermore, it is not necessary to employ extraneous protective structures that are designed to isolate the sensor circuitry within the housing, as is done with known sensor designs. The stresses caused by such protective structures introduce inaccuracies into the sensor's measurements, and the elimination of these protective structures likewise eliminate the inherent inaccuracies. A more accurate sensor is thereby achieved.

The invention may be varied in many ways. For example, the second wafer, which may be thought of as a backing plate, may be made of silicon instead of glass. Suitable silicon-to-silicon attachment techniques may need to be used in such a case.

An advantage of the invention is that stresses created during connection of the glass plate to the header are significantly reduced by using unconnected adhesive applications as described herein. An increase in the sensor's accuracy and reliability is thereby realized.

Another advantage is that multiple numbers of sensors may be manufactured simultaneously at a significantly reduced cost. The creation of a reference pressure chamber between the sensor circuitry module and the glass portion provides a reliable method of comparing pressures and eliminates expensive manufacturing procedures that would otherwise need to be used to provide a reference pressure chamber. Furthermore, the invention as disclosed is conducive to mass-production techniques that further economize and streamline the manufacture of pressure sensors.

Another advantage is that the humidity pre-treatment of the sensor die reduces the effect of humidity on the sensor later in the sensor's lifetime.

While the invention has been disclosed in its preferred form, the specific embodiments thereof as disclosed and illustrated herein are not to be considered in a limiting sense as numerous variations are possible. The subject matter of the invention includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the invention of the present disclosure.

What is claimed is:

1. An air pressure sensor, comprising:
   a sensor die that is exposed on at least one side to an air pressure that is to be measured;
   a glass portion secured to the sensor die such that a vacuum reference cavity is enclosed therebetween;
   a housing that includes an enclosure in which the-sensor die and glass portion are housed, the enclosure being pneumatically connected to the air pressure that is to be measured;
   an electrical connector that communicates air pressure data from the sensor die; and
   a plurality of unconnected adhesive elements that flexibly attach the glass portion within the enclosure to eliminate thermal stresses.

2. The air pressure sensor of claim 1, wherein the sensor die has an electrical connection, the sensor further comprising:
   a conductive pin having a first end that is within the cavity and a second end that is outside the enclosure; and
   an electrical lead, disposed within the enclosure, that connects the electrical connection to the conductive pin.

3. The air pressure sensor of claim 2, wherein each of the electrical connection, the conductive pin, and the electrical lead have exterior surfaces that are covered with gold.

4. The air pressure sensor of claim 1, wherein the glass portion has a polygonal shape with a predetermined number of corners, and wherein the unconnected adhesive elements are applied to secure the glass portion within the enclosure at the predetermined number of corners.

5. The air pressure sensor of claim 4, wherein the glass portion has four corners, and wherein each of the unconnected adhesive elements attach one of the four corners of the glass portion within the enclosure.

6. The air pressure sensor of claim 1, wherein the unconnected adhesive elements comprise a plurality of dots of adhesive applied at selected locations of the glass portion.

7. The air pressure sensor of claim 1, wherein the unconnected adhesive elements are dots of silicone adhesive.

8. An air pressure sensor, comprising:
   a sensor die that is exposed on at least one side to an air pressure that is to be measured;
   a glass portion secured to the sensor die such that a vacuum reference cavity is enclosed therebetween;
   a housing that includes an enclosure in which the sensor die and glass portion are flexibly attached therein, the enclosure being pneumatically connected to the air pressure that is to be measured; and
   an electrical connector that communicates air pressure data from the sensor die;
   wherein the sensor die is treated in an enhanced humidity environment prior to its being attached in the enclosure.

9. The air pressure sensor of claim 8, wherein the glass portion is flexibly attached within the enclosure by a plurality of unconnected adhesive elements.

10. The air pressure sensor of claim 8, wherein the sensor die has an electrical connection, the sensor further comprising:
    a conductive pin having a first end that is within the cavity and a second end that is outside the enclosure; and
    an electrical lead, disposed within the enclosure, that connects the electrical connection to the conductive pin;
    wherein each of the electrical connection, the conductive pin, and the electrical lead have exterior surfaces that are covered with gold.

* * * * *